United States Patent
Lin

(10) Patent No.: US 8,304,339 B2
(45) Date of Patent: Nov. 6, 2012

(54) SOLDER BUMP WITH INNER CORE PILLAR IN SEMICONDUCTOR PACKAGE

(75) Inventor: Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/237,828

(22) Filed: Sep. 20, 2011

(65) Prior Publication Data

US 2012/0009783 A1    Jan. 12, 2012

Related U.S. Application Data

(62) Division of application No. 11/859,416, filed on Sep. 21, 2007, now Pat. No. 8,039,960.

(51) Int. Cl.
*H01L 33/62* (2010.01)
(52) U.S. Cl. .. 438/613; 438/612; 257/737; 257/E23.032
(58) Field of Classification Search .................. 257/697, 257/722, 737, 738, 739, 771, 778, 779, 780, 257/E23.032, E23.026, E21.508, E23.033, 257/E23.068, E23.069; 438/107, 108, 109, 438/110, 118, 612, 613, 614
See application file for complete search history.

(56) References Cited

U.S. PATENT DOCUMENTS

| | | | |
|---|---|---|---|
| 5,534,127 A | 7/1996 | Sakai | |
| 5,640,052 A * | 6/1997 | Tsukamoto | 257/781 |
| 6,077,765 A | 6/2000 | Naya | |
| 6,281,107 B1 | 8/2001 | Moriyama | |
| 7,268,430 B2 | 9/2007 | Suga et al. | |
| 2002/0064933 A1 | 5/2002 | Ueoka | |
| 2002/0068425 A1 | 6/2002 | Chen et al. | |
| 2003/0052156 A1 | 3/2003 | Kim et al. | |
| 2004/0166661 A1 | 8/2004 | Lei | |
| 2004/0266066 A1 | 12/2004 | Wang | |
| 2005/0062169 A1 | 3/2005 | Dubin et al. | |
| 2005/0104222 A1* | 5/2005 | Jeong et al. | 257/778 |
| 2005/0127508 A1 | 6/2005 | Lee et al. | |
| 2005/0224966 A1 | 10/2005 | Fogel et al. | |
| 2005/0258539 A1 | 11/2005 | Minda | |
| 2006/0051954 A1 | 3/2006 | Lin et al. | |
| 2006/0113681 A1 | 6/2006 | Jeong et al. | |
| 2006/0292711 A1 | 12/2006 | Su et al. | |
| 2008/0224308 A1 | 9/2008 | Lee | |
| 2010/0224987 A1* | 9/2010 | Hochstenbach | 257/693 |

* cited by examiner

*Primary Examiner* — Samuel Gebremariam
*Assistant Examiner* — Yosef Gebreyesus
(74) *Attorney, Agent, or Firm* — Robert D. Atkins; Patent Law Group: Atkins & Associates, P.C.

(57) ABSTRACT

A flip chip semiconductor package has a substrate with a plurality of active devices. A contact pad is formed on the substrate in electrical contact with the plurality of active devices. A passivation layer, second barrier layer, and adhesion layer are formed between the substrate and an intermediate conductive layer. The intermediate conductive layer is in electrical contact with the contact pad. A copper inner core pillar is formed by plating over the intermediate conductive layer. The inner core pillar has a rectangular, cylindrical, toroidal, or hollow cylinder form factor. A solder bump is formed around the inner core pillar by plating solder material and reflowing the solder material to form the solder bump. A first barrier layer and wetting layer are formed between the inner core pillar and solder bump. The solder bump is in electrical contact with the intermediate conductive layer.

21 Claims, 4 Drawing Sheets

SOLDER BUMP WITH INNER CORE PILLAR IN SEMICONDUCTOR PACKAGE

CLAIM TO DOMESTIC PRIORITY

The present application is a division of U.S. patent application Ser. No. 11/859,416, filed Sep. 21, 2007, and claims priority to the foregoing parent application pursuant to 35 U.S.C. §120.

FIELD OF THE INVENTION

The present invention relates in general to semiconductor packaging, and more particularly, to solder bump structures in flip chip packaging of semiconductor devices.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin counts. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to contact pads disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

The reliability and integrity of the solder bump is important to testing, manufacturing yield, and longevity of the product while in service. Device reliability is a function of the interconnect material and structural integrity of each solder bump and its effectiveness as an electrical interconnect. Many prior art devices have attempted to modify the basic structure of the solder bump, including encapsulating a first bump within a second bump, as described in U.S. Pat. No. 6,077,765 and US patent application 20040266066. However, these prior art solder bump structures are known to exhibit weak solder joints, particularly with fine pitch applications. In addition, some prior art bump structures continue to have high joint resistance, which increases power consumption and heat dissipation.

A need exists for a solder bump structure with enhanced strength and reliability and lower joint resistance.

SUMMARY OF THE INVENTION

In one embodiment, the present invention is a method of making a semiconductor device comprising the steps of providing a semiconductor wafer having a plurality of active or passive devices formed on the semiconductor wafer, forming a first conductive layer over the semiconductor wafer electrically connected to the active or passive devices, forming an insulation layer over the first conductive layer and semiconductor wafer, removing a portion of the insulating layer to expose the first conductive layer, forming a second conductive layer over the first conductive layer and insulation layer, forming a third conductive layer over the second conductive layer, forming a fourth conductive layer over the third conductive layer, and forming a core pillar having a hollow interior region over the fourth conductive layer and centered over first conductive layer. The core pillar has a width less than a width of the exposed first conductive layer. The method further includes the steps of forming a fifth conductive layer over the fourth conductive layer and core pillar and into the hollow interior region, forming a sixth conductive layer over the fifth conductive layer and core pillar and into the hollow interior region, and forming a bump material over the sixth conductive layer.

In another embodiment, the present invention is a method of making a semiconductor device comprising the steps of providing a semiconductor substrate, forming a first conductive layer over the semiconductor substrate, forming an insulation layer over the first conductive layer and semiconductor substrate, removing a portion of the insulating layer to expose the first conductive layer, forming a UBM layer over the first conductive layer, and forming a core pillar over the UBM layer and centered over the first conductive layer. The core pillar has a width less than a width of the exposed first conductive layer. The method further includes the steps of forming a second conductive layer over the UBM layer and core pillar, forming a third conductive layer over the second conductive layer, and forming a bump over the third conductive layer.

In another embodiment, the present invention is a method of making a semiconductor device comprising the steps of providing a semiconductor substrate, forming a first conductive layer over the semiconductor substrate, forming a UBM layer over the first conductive layer, and forming a core pillar over the UBM layer and centered over first conductive layer. The core pillar has a width less than a width of the first conductive layer. The method further includes the steps of conformally applying a second conductive layer over the UBM layer and core pillar, and forming a bump over the second conductive layer.

In another embodiment, the present invention is a method of making a semiconductor device comprising the steps of providing a semiconductor substrate, forming a first conductive layer over the semiconductor substrate, forming a UBM layer over the first conductive layer, forming a core pillar over the UBM layer and first conductive layer, and forming a bump over the core pillar. The core pillar has a width less than a width of the first conductive layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material by thermal diffusion or ion implantation. The active surface is substantially planar and uniform with electrical interconnects, such as bond pads.

Figure 1:
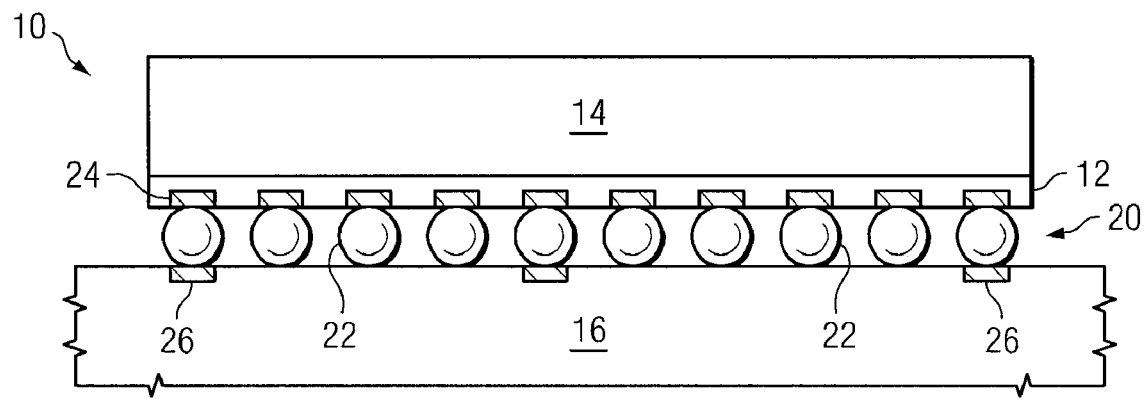
FIG. 1 is a flip chip semiconductor package with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin counts. Flip chip style packaging 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads 24, which are disposed on active area 12. In the present example, bump pads 24 have a fine pitch, e.g., on the order of 150 micrometers (μm). The bump pads 24 connect to the active circuits by conduction tracks in active area 12. The solder bumps 22 are electrically and mechanically connected to contact pads 26 on carrier substrate 16 by a solder reflow process. The flip chip semiconductor package provides a short electrical conduction path from the active devices on die 14 to conduction tracks on carrier substrate 16 in order to reduce signal propagation, lower capacitance, and achieve overall better circuit performance.

Figure 2A:
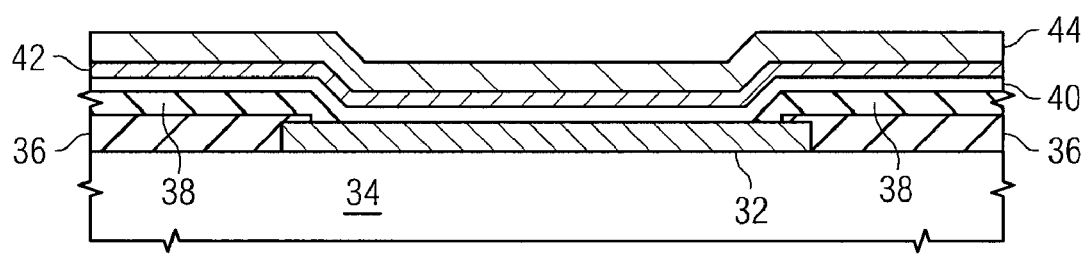
FIGS. 2a-2d illustrate the formation of an inner core pillar in a solder bump and supporting structure.

FIGS. 2a-2d illustrate cross-sectional views of the formation of a support structure for a solder bump. Note that for FIGS. 2-4 the wafer is oriented with its active surface facing up. In FIG. 2a, metal contact pad 32 is formed on silicon substrate 34. Contact pad 32 is made of aluminum (Al), copper (Cu), or aluminum/copper alloys. Contact pad 32 is electrically connected to active and passive devices through conduction tracks or layers formed on substrate 34. A solder bump will later be formed to connect to the metal contact pad. A first passivation layer 36 is formed over substrate 34 with an opening to expose metal contact pad 32. The opening is realized by removing a portion of passivation layer 36 through a photoresist mask defined etching process. The first passivation layer 36 can be made with silicon nitride (SiN), silicon dioxide (SiO2), silicon oxynitride (SiON), polyimide, benzocyclobutene (BCB), polybenzoxazole (PBO), or other insulating material. A second passivation layer 38 is formed over passivation layer 36. Passivation layer 38 can be made using similar material as described for passivation layer 36. Again, an opening is formed by removing a portion of passivation layer 38 to expose metal contact pad 32. In another embodiment, passivation layers 36-38 are formed by repassivation. The under bump metallization (UBM) uses adhesion layer 40, optional barrier layer 42, and seed layer 44. An adhesion layer 40 is formed over passivation layer 38 for bonding to barrier layer 42. Adhesion layer 40 can be titanium (Ti), Al, titanium tungsten (TiW), and chromium (Cr). Barrier layer 42 inhibits the diffusion of Cu into the active area of the die. Barrier layer 42 can be made of nickel (Ni), Ni-alloy, platinum (Pt), palladium (Pd), TiW, and chromium copper (CrCu). Seed layer 44 is formed over barrier layer 42. Seed layer 44 can be made with Cu, Ni, nickel vanadium (NiV), Cu, gold (Au), or Al. Seed layer 44 follows the contour of passivation layers 36-38 and contact pad 32 and acts as an intermediate conductive layer formed between metal contact pad 32 and the solder bump. Seed layer 44 electrically connects to contact pad 32.

Figure 2B:
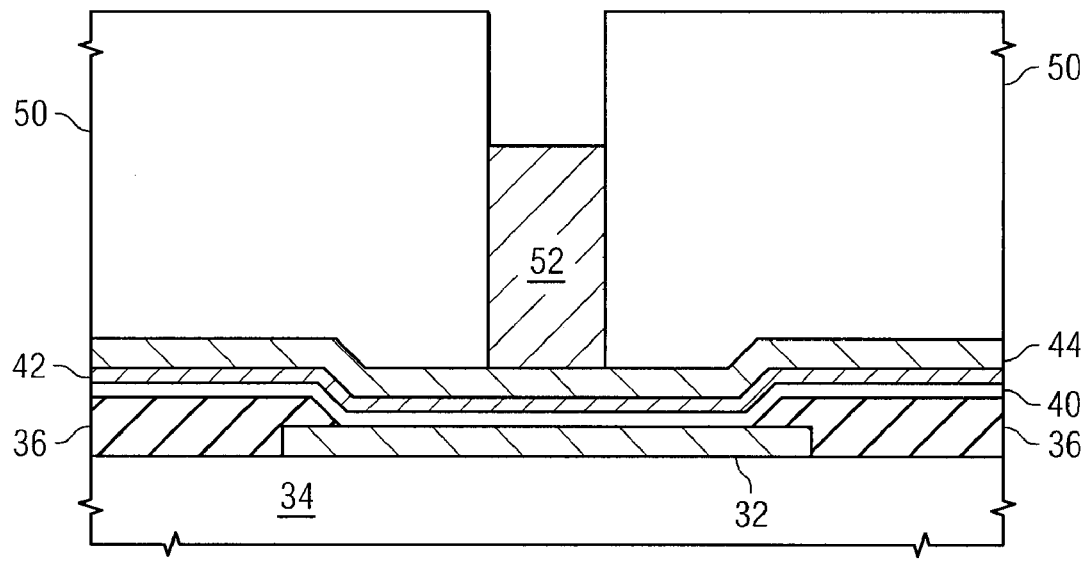

In FIG. 2b, a photoresist layer 50 is coated, exposed, developed, and etched to form a first opening or column having a width, which is less than that of contact pad 32. The first opening is located about central to contact pad 32. An inner core pillar 52 is deposited in the first opening between photoresist layers 50 by an electroless plating or electrolytic plating process. Core pillar 52 is made of Cu, Ni, Al, or other suitable metal. By way of example, inner core pillar 52 can have a rectangular or cylindrical form factor, although other shapes are contemplated as well. The height of inner core pillar 52 is about two-thirds the thickness of photoresist layer 50 or, in one embodiment, about 50 μm in height and 50 μm in diameter.

Figure 2C:
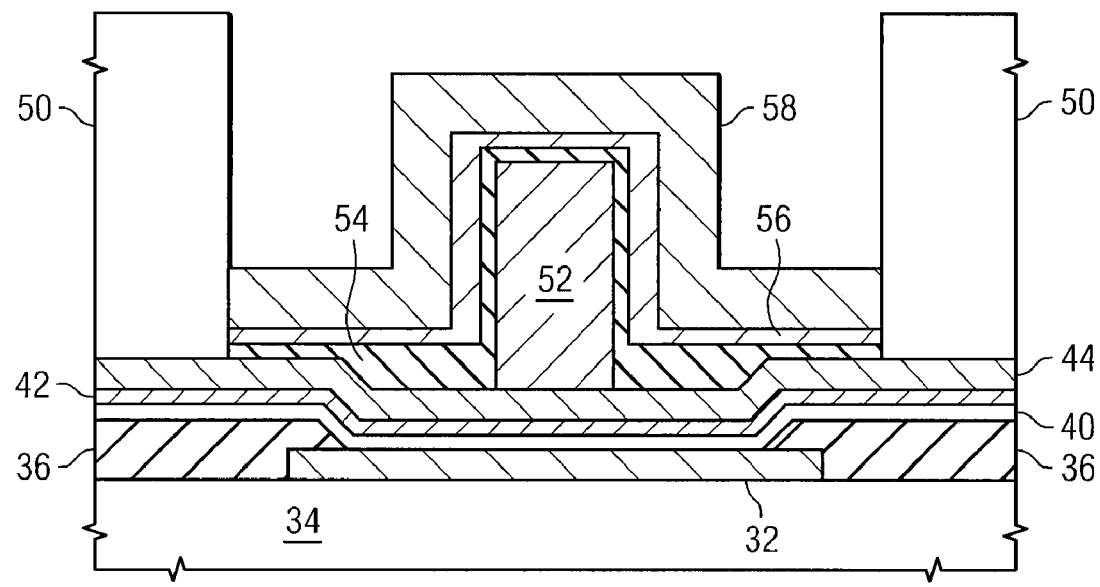

In FIG. 2c, photoresist layer 50 is exposed, developed, and etched again, without completely stripping the layer away, to form a second opening or column over the first opening. The second opening has a width, which is greater than the width of contact pad 32. The distance from the edge of the second opening in photoresist layer 50 to core pillar 52 is less than the thickness of photoresist layer 50. Barrier layer 54 is formed over seed layer 44 and core pillar 52 for metal (Cu) diffusion isolation. Barrier layer 54 is made of Ni, Pt, or other suitable metal. Wetting layer 56 is formed over barrier layer 54. Wetting layer 56 is made of Cu, Au, or Ag. In an alternate embodiment, the sequence can be switched, i.e., barrier layer 54 can be formed over wetting layer 56.

Solder layer 58 is formed by depositing electrically conductive material through an electrolytic plating or electroless plating process over wetting layer 56. The solder material can be any metal, e.g., tin (Sn), lead (Pb), Ni, Au, silver (Ag), Cu, bismuthinite (Bi) and alloys thereof, or mixtures of other conductive materials. In one embodiment, the solder material is 63 percent weight of Sn and 37 percent weight of Pb. The barrier layer and wetting layer between solder layer 58 and seed layer 44 enhance reliability of the bump support structure.

Figure 2D:
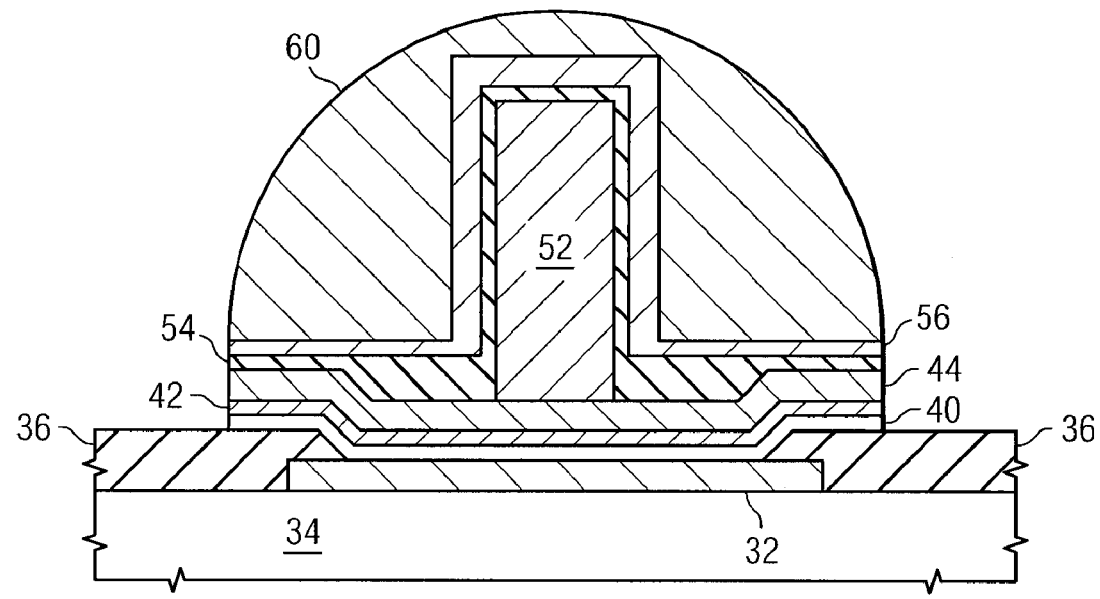

In FIG. 2d, any remaining portion of photoresist layer 50 is stripped away. An etching process removes any portion of seed layer 44, barrier layer 42, and adhesion layer 40 outside the region of the solder bump structure, for example in applications where the UBM layers extend continuously between adjacent solder bumps. Solder layer 58 is reflowed by heating the conductive material above its melting point to form a spherical ball or bump 60 over semiconductor substrate 34. In one embodiment, solder bump 60 is about 75 µm in height and 80 µm in diameter. Solder bump 60 electrically contacts core pillar 52, seed layer 44, and metal contact pad 32.

As a feature of the present invention, the solder bump is formed around barrier layer 54, wetting layer 56, and inner core pillar 52 by plating solder material and then reflowing the solder material to form the solder bump. In one embodiment, the inner core pillar 52 extends into the solder bump at least two-thirds a height of the solder bump. The core pillar height is typically less than the pitch between adjacent solder bumps in bump structure 20. The core pillar width is typically about 40% to 60% of the bump diameter. The distance from the solder bottom edge to the core pillar edge is about 20% to 30% of the bump diameter. These features reduce solder joint resistance and improve strength and reliability for the bump support structure.

Figure 3A:
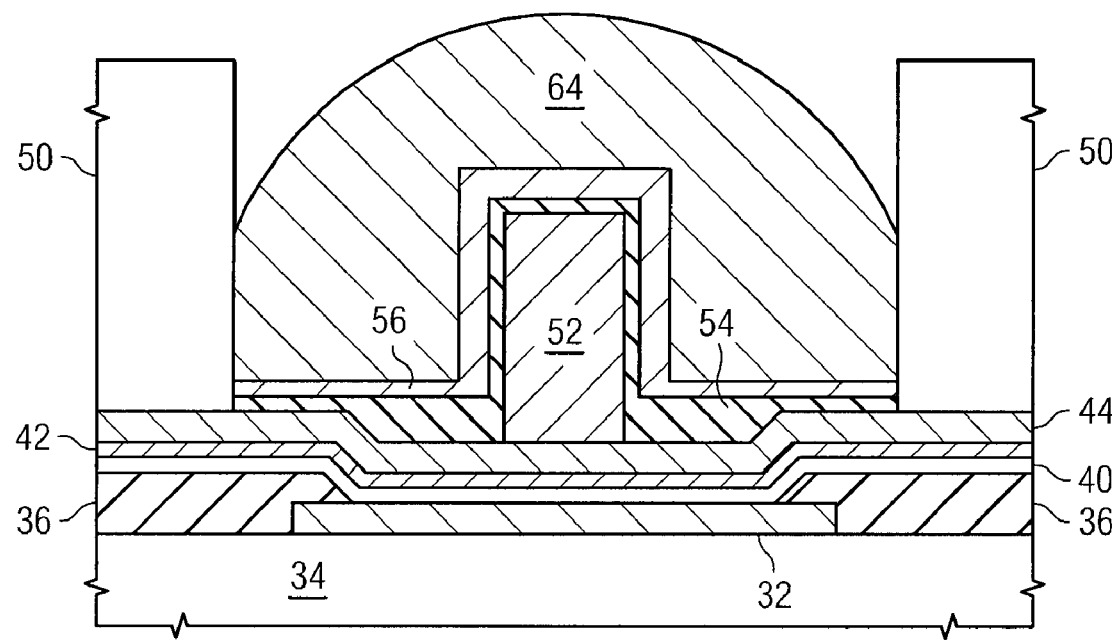
FIGS. 3a-3b illustrate formation of an inner core pillar in a solder bump using screen printed solder.

An alternate embodiment of the flip chip package is shown in FIG. 3a. As described above, metal contact pad 32 is formed on substrate 34. Contact pad 32 is electrically connected to active and passive devices through conduction layers formed on substrate 34. Passivation layer(s) 36 is formed over substrate 34 with an opening to expose metal contact pad 32. An adhesion layer 40 is formed over passivation layer 36 for bonding to barrier layer 42. Barrier layer 42 inhibits the diffusion of Cu into the active area of the die. Seed layer 44 is formed over barrier layer 42. Seed layer 44 is an intermediate conductive layer formed between metal contact pad 32 and the solder bump. Seed layer 44 electrically connects to contact pad 32.

Photoresist layer 50 is first coated, exposed, developed, and etched to form a first opening or column, as described in FIG. 2b, having a width which is less than that of contact pad 32. The first opening is located about central to contact pad 32. An inner core pillar 52 is deposited in the first opening between photoresist layers 50 by an electroless plating or electrolytic plating process. The height of inner core pillar 52 is about two-thirds the thickness of photoresist layer 50. Photoresist layer 50 is again exposed, developed, and etched, without completely stripping the layer away, to form a second opening or column over the first opening. The second opening has a width, which is greater than the width of contact pad 32, as shown in FIG. 3a. The distance from the edge of the second opening in photoresist layer 50 to core pillar 52 is less than the thickness of photoresist layer 50. Barrier layer 54 is formed over seed layer 44 and core pillar 52 for metal (Cu) diffusion isolation. Wetting layer 56 is formed over barrier layer 54.

A solder layer is formed by depositing electrically conductive material through a screen printing process over wetting layer 56. The solder material can be any metal, e.g., Sn, Pb, Ni, Au, Ag, Cu, Bi, and alloys thereof, or mixtures of other conductive materials. In one embodiment, the solder material is 63 percent weight of Sn and 37 percent weight of Pb. After plating, the solder layer is reflowed to form ball or bump 64 between photoresist layers 50.

Figure 3B:
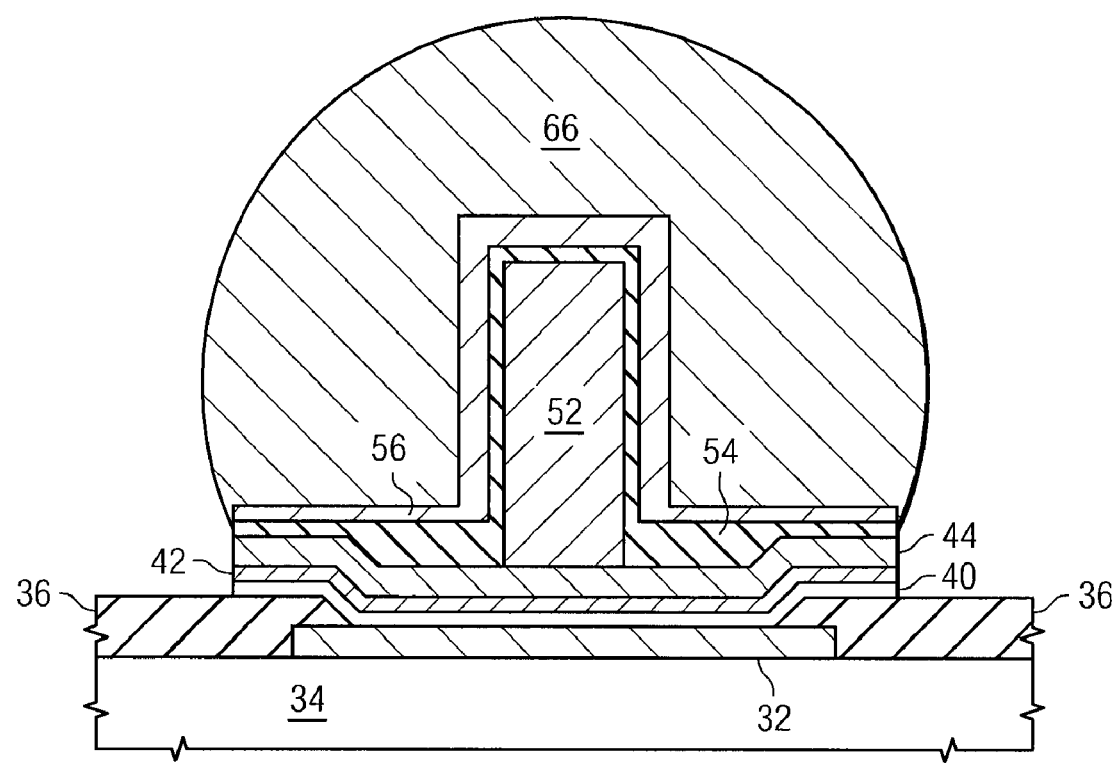

In FIG. 3b, any remaining portion of photoresist layer 50 is stripped away. An etching process removes any portion of seed layer 44, barrier layer 42, and adhesion layer 40 outside the region of the solder bump structure. Solder bump 64 is reflowed a second time by heating the conductive material above its melting point to form a spherical ball or bump 66 disposed over semiconductor substrate 34. Solder bump 66 electrically contacts core pillar 52, seed layer 44, and metal contact pad 32.

The process of forming the solder bump around inner core pillar 52 by plating solder material and then reflowing the solder material twice to form the solder bump reduces solder joint resistance and improves strength and reliability for the bump support structure. The inner core pillar 52 extends into the solder bump at least two-thirds a height of the solder bump. In addition, barrier layer 54 and wetting layer 56 formed over the inner core pillar also enhance strength and reliability for the bump support structure.

Figure 4A:
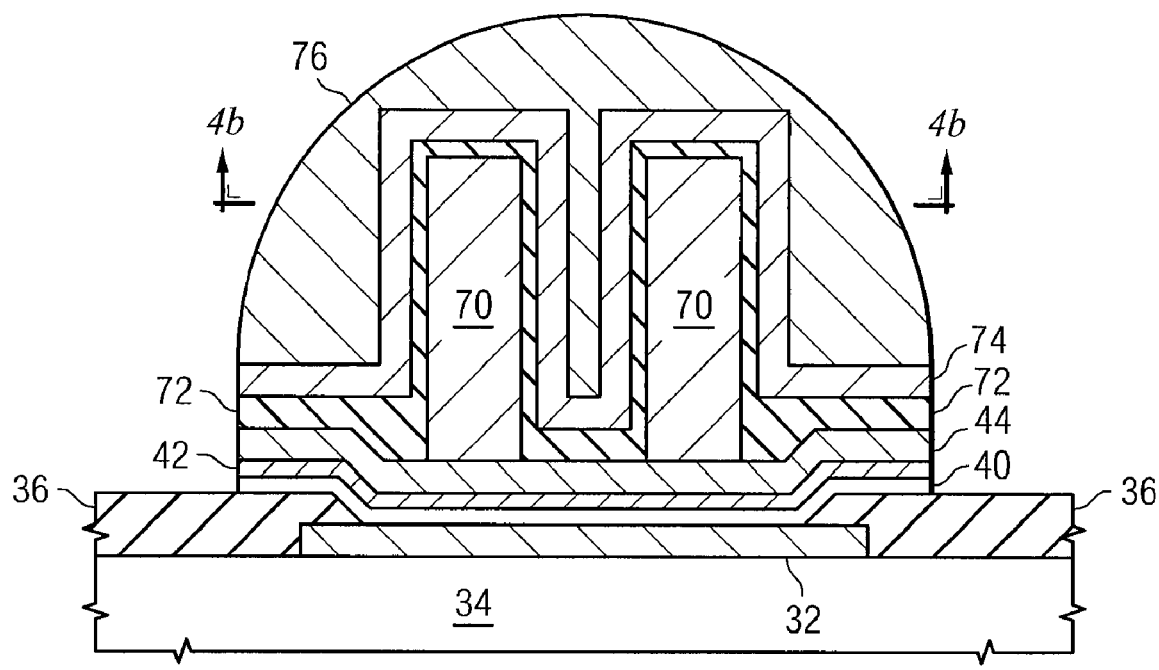
FIGS. 4a-4b illustrate the formation of a hollow cylinder inner core pillar in a solder bump and supporting structure.

Another embodiment of the flip chip package is shown in FIG. 4a. As described above, metal contact pad 32 is formed on substrate 34. Contact pad 32 is electrically connected to active and passive devices through conduction layers formed on substrate 34. Passivation layer(s) 36 is formed over substrate 34 with an opening to expose metal contact pad 32. An adhesion layer 40 is formed over passivation layer 36 for bonding barrier layer 42. Barrier layer 42 inhibits the diffusion of Cu into the active area of the die. Seed layer 44 is formed over barrier layer 42. Seed layer 44 is an intermediate conductive layer formed between metal contact pad 32 and the solder bump. Seed layer 44 electrically connects to contact pad 32.

Figure 4B:
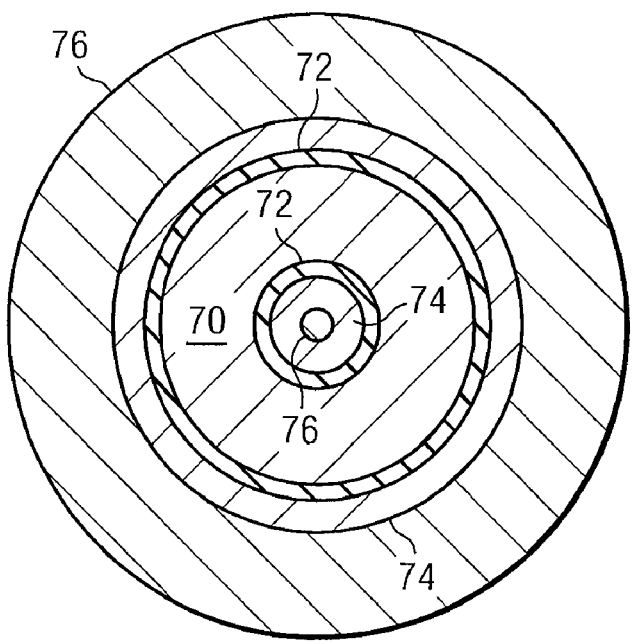

A photoresist layer is first coated, exposed, developed, and etched to form a first opening or column having a width, which is less than that of contact pad 32. The first opening in the photoresist layer has the form of a cylinder with its interior containing photoresist material. An inner core pillar 70 is deposited in the first opening between the photoresist layers by electroless plating or electrolytic plating. Due to the form of the first opening, inner core pillar 70 has a cylindrical shape with a hollow interior, as seen in FIG. 4b which is a top view of bump 76 and supporting structure at line 4b-4b. In another embodiment, the inner core pillar can be toroidal in shape. The height of inner core pillar 70 is about two-thirds the thickness of the photoresist layer. The photoresist layer is again exposed, developed, and etched, without completely stripping the layer away, to form a second opening or column over the first opening. The second opening has a width, which is greater than the width of contact pad 32. The distance from the edge of the second opening in the photoresist layer to core pillar 70 is less than the thickness of the photoresist layer. Barrier layer 72 is formed over seed layer 44 and core pillar 70 for metal (Cu) diffusion isolation. Wetting layer 74 is formed over barrier layer 72.

A solder layer is formed by depositing electrically conductive material by electroless plating, electrolytic plating, or screen printing over wetting layer 72. The solder material can be any metal, e.g., Sn, Pb, Ni, Au, Ag, Cu, Bi, and alloys thereof, or mixtures of other conductive materials. In one embodiment, the solder material is 63 percent weight of Sn and 37 percent weight of Pb.

Any remaining portion of the photoresist layer is stripped away. An etching process removes any portion of seed layer 44, barrier layer 42, and adhesion layer 40 outside the region of the solder bump structure. Solder bump 64 is reflowed by heating the conductive material above its melting point to form a spherical ball or bump 76 disposed over semiconductor substrate 34. Solder bump 76 electrically contacts core pillar 70, seed layer 44, and metal contact pad 32.

In summary, the process of forming the solder bump around an inner core pillar by plating solder material and then reflowing the solder material once or multiple times to form the solder bump reduce solder joint resistance and improves strength and reliability for the bump support structure. The inner core pillar extends into the solder bump at least two-thirds a height of the solder bump. In addition, the barrier layer and wetting layer formed over the inner core pillar also enhance strength and reliability for the bump support structure.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer including a plurality of active or passive devices formed on the semiconductor wafer;
   forming a first conductive layer over the semiconductor wafer electrically connected to the active or passive devices;
   forming an insulating layer over the first conductive layer and semiconductor wafer;
   removing a portion of the insulating layer to expose the first conductive layer;
   forming a second conductive layer over the first conductive layer and insulating layer;
   forming a third conductive layer over the second conductive layer;
   forming a fourth conductive layer over the third conductive layer;
   forming a single core pillar including a hollow interior region over the fourth conductive layer and centered over first conductive layer, the single core pillar including a width less than a width of the exposed first conductive layer;
   forming a fifth conductive layer over the fourth conductive layer and single core pillar and within the hollow interior region;
   forming a sixth conductive layer over the fifth conductive layer and single core pillar and within the hollow interior region; and
   forming a bump material over the sixth conductive layer.

2. The method of claim 1, further including reflowing the bump material to form a spherical bump.

3. The method of claim 2, wherein the single core pillar extends into the spherical bump at least two-thirds of a height of the spherical bump.

4. The method of claim 2, wherein the single core pillar has a width 40-60% of a width of a diameter of the spherical bump.

5. The method of claim 1, wherein forming the single core pillar includes:
   forming a photoresist layer;
   forming an opening in the photoresist layer; and
   depositing conductive material in the opening of the photoresist layer.

6. The method of claim 1, wherein the single core pillar includes copper, nickel, or other conductive material.

7. A method of making a semiconductor device, comprising:
   providing a semiconductor substrate;
   forming a first conductive layer over the semiconductor substrate;
   forming an insulating layer over the first conductive layer and semiconductor substrate;
   removing a portion of the insulating layer to expose the first conductive layer;
   forming an under bump metallization (UBM) layer over the first conductive layer;
   forming a single core pillar including a hollow interior region over the UBM layer and centered over first conductive layer, the single core pillar including a width less than a width of the exposed first conductive layer and extending into the bump at least two-thirds of a height of the bump;
   forming a second conductive layer over the UBM layer and single core pillar;
   forming a third conductive layer over the second conductive layer; and
   forming a bump over the third conductive layer.

8. The method of claim 7, wherein forming the UBM layer includes:
   forming a fourth conductive layer over the first conductive layer;
   forming a fifth conductive layer over the fourth conductive layer; and
   forming a sixth conductive layer over the fifth conductive layer.

9. The method of claim 7, wherein the single core pillar has a width 40-60% of a width of a diameter of the bump.

10. The method of claim 7, further including:
    forming the second conductive layer into the hollow interior region of the single core pillar; and
    forming the third conductive layer over the second conductive layer and into the hollow interior region of the single core pillar.

11. The method of claim 7, wherein the single core pillar has a rectangular, cylindrical, or toroidal shape.

12. A method of making a semiconductor device, comprising:
    providing a semiconductor substrate;
    forming a first conductive layer over the semiconductor substrate;
    forming an under bump metallization (UBM) layer over the first conductive layer;
    forming a single core pillar including a hollow interior region over the UBM layer and centered over the first conductive layer, the single core pillar including a width less than a width of the first conductive layer;
    conformally applying a second conductive layer over the UBM layer and single core pillar; and
    forming a bump over the second conductive layer.

13. The method of claim 12, wherein forming the UBM layer includes:
    forming a third conductive layer over the first conductive layer;
    forming a fourth conductive layer over the third conductive layer; and
    forming a fifth conductive layer over the fourth conductive layer.

14. The method of claim 12, wherein the single core pillar extends into the bump at least two-thirds of a height of the bump.

15. The method of claim 12, wherein the single core pillar has a width 40-60% of a width of a diameter of the bump.

16. The method of claim 12, further including conformally applying the second conductive layer over the single core pillar and into the hollow interior region.

17. The method of claim 12, wherein the single core pillar has a rectangular, cylindrical, or toroidal shape.

18. A method of making a semiconductor device, comprising:
   providing a semiconductor substrate;
   forming a first conductive layer over the semiconductor substrate;
   forming an under bump metallization (UBM) layer over the first conductive layer;
   forming a core pillar over the UBM layer and first conductive layer, the core pillar including a width less than a width of the first conductive layer;
   forming a barrier layer within a hollow interior region of the core pillar;
   forming a wetting layer within the hollow interior region of the core pillar; and
   forming a bump over the core pillar.

19. The method of claim 18, wherein the core pillar extends into the bump at least two-thirds of a height of the bump.

20. The method of claim 18, wherein the core pillar has a width 40-60% of a width of a diameter of the bump.

21. The method of claim 18, wherein forming the UBM layer includes:
   forming a fourth conductive layer over the first conductive layer;
   forming a fifth conductive layer over the fourth conductive layer; and
   forming a sixth conductive layer over the fifth conductive layer.

\* \* \* \* \*